United States Patent
De Coi et al.

(10) Patent No.: US 9,695,010 B2
(45) Date of Patent: Jul. 4, 2017

(54) CONNECTING DEVICE FOR MEASUREMENT TAPES IN ELEVATOR DEVICES

(71) Applicant: CEDES AG, Landquart (CH)

(72) Inventors: Beat De Coi, Sargans (CH); Christian E. Thöny, Oberägeri (CH); Tobias Leutenegger, Chur (CH); Jan Giger, Jenaz (CH)

(73) Assignee: Cedes AG, Landquart (CH)

( * ) Notice: Subject to any disclaimer, the term of this patent is extended or adjusted under 35 U.S.C. 154(b) by 421 days.

(21) Appl. No.: 14/469,751

(22) Filed: Aug. 27, 2014

(65) Prior Publication Data

US 2015/0060210 A1 Mar. 5, 2015

(30) Foreign Application Priority Data

Aug. 29, 2013 (EP) .................................... 13004257

(51) Int. Cl.
*B66B 1/34* (2006.01)
*G01D 5/347* (2006.01)
*G01R 31/02* (2006.01)

(52) U.S. Cl.
CPC .......... *B66B 1/3461* (2013.01); *B66B 1/3492* (2013.01); *G01D 5/347* (2013.01); *G01R 31/021* (2013.01)

(58) Field of Classification Search
CPC .... B66B 1/3461; B66B 1/3492; G01D 5/347; G01R 13/021
USPC ........ 187/247, 277, 391, 393, 394, 414, 900
See application file for complete search history.

(56) References Cited

U.S. PATENT DOCUMENTS

| | | | |
|---|---|---|---|
| 3,963,098 A * | 6/1976 | Lewis ................... | B66B 1/3492 187/394 |
| 4,433,756 A | 2/1984 | Caputo et al. | |
| 4,674,603 A * | 6/1987 | Estrella ................. | B66B 1/3492 187/394 |
| 4,798,267 A * | 1/1989 | Foster ................... | B66B 1/3492 187/389 |
| 5,135,081 A * | 8/1992 | Watt ...................... | B66B 1/3492 187/394 |

(Continued)

FOREIGN PATENT DOCUMENTS

FR 2 523 105 A1 9/1983
WO 03/066496 A1 8/2003

OTHER PUBLICATIONS

European Search Report (Application No. 13004257.5) dated Feb. 6, 2014.

*Primary Examiner* — Anthony Salata
(74) *Attorney, Agent, or Firm* — Burr & Brown, PLLC

(57) ABSTRACT

With regard to the effect of a settling building, a connecting device for connecting a transmission device for transmitting information, wherein the transmission device is attached to a measurement tape for determining the position of a cab in an elevator shaft, wherein the connecting device is designed as a guide bracket for guiding and/or supporting the measurement tape, so that it at least partially surrounds the measurement tape, and wherein the guide bracket has at least one opening for reading out the marking unit, and wherein the connecting device has at least one connection contact for connecting to one of the communication lines and/or supply lines, wherein the at least one connection contact is movably supported in the connecting device.

16 Claims, 20 Drawing Sheets

(56) References Cited

U.S. PATENT DOCUMENTS

| | | | | |
|---|---|---|---|---|
| 5,925,859 A | * | 7/1999 | Miller | B66B 1/50 187/283 |
| 6,945,296 B2 | * | 9/2005 | Kunz | B66B 1/3492 156/391 |
| 6,986,409 B2 | * | 1/2006 | Birbaumer | B66B 1/3492 187/394 |
| 7,669,698 B2 | * | 3/2010 | Jahkonen | B66B 1/3492 187/247 |
| 9,352,934 B1 | * | 5/2016 | Lee | B66B 1/3492 |
| 9,469,501 B2 | * | 10/2016 | Lee | B66B 1/3492 |
| 2004/0094368 A1 | | 5/2004 | Birbaumer | |

* cited by examiner

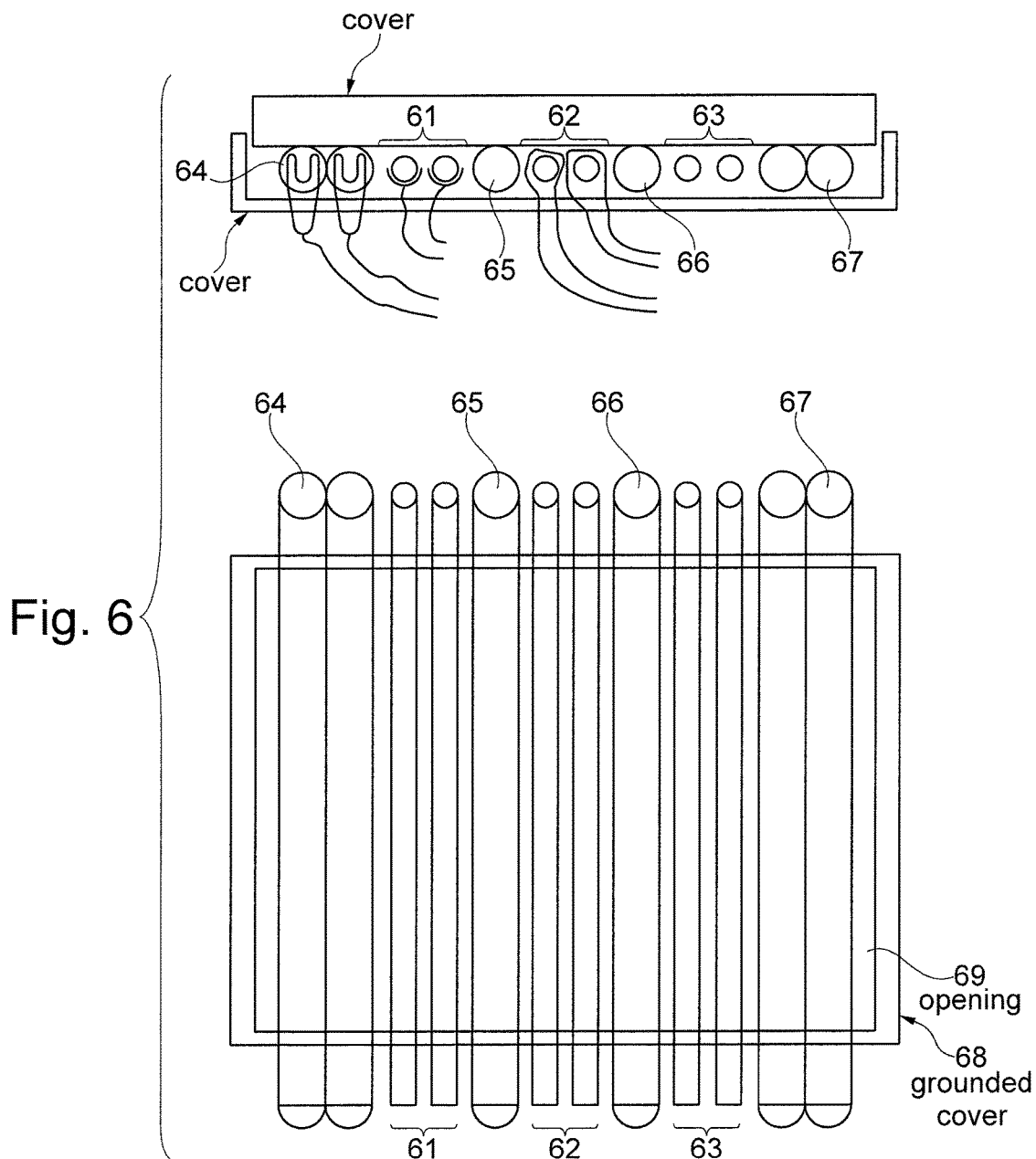

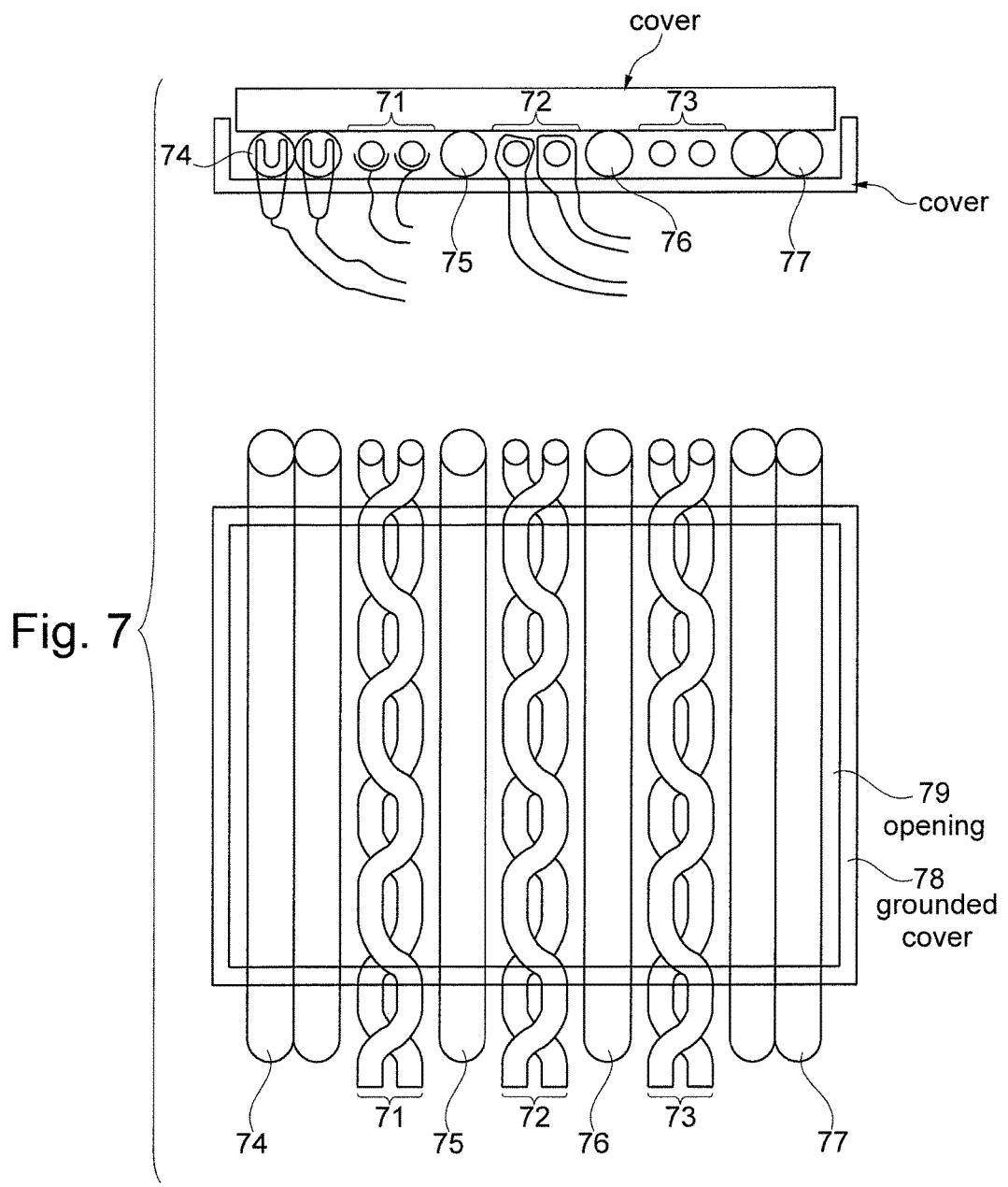

CONNECTING DEVICE FOR MEASUREMENT TAPES IN ELEVATOR DEVICES

This application claims the benefit under 35 USC §119 (a)-(d) of European Application No. 13 004 257.5 filed Aug. 29, 2013, the entirety of which is incorporated herein by reference.

FIELD OF THE INVENTION

The present invention relates to a connecting device for connecting a transmission device in connection with a measurement tape in an elevator, a peripheral device, and an elevator device.

BACKGROUND OF THE INVENTION

According to the related art, up to now, cable routing has been passed through the elevator shaft, in, for example, cable shafts.

SUMMARY OF THE INVENTION

In connection with measurement tapes which enable integrated line routing, the object of the present invention is to be able to establish preferably flexible access to the electric lines of the measurement tape.

Accordingly, the connecting device according to the present invention for connecting a transmission device for transmitting information is designed as a guide bracket for guiding and/or supporting the measurement tape, so that it at least partially surrounds the measurement tape, and wherein the guide bracket has at least one opening for reading out the marking unit. The connecting device according to the present invention is thus to be seen in connection with a measurement tape which has the particular feature of being provided with a transmission device. The measurement tape is used simultaneously for determining the position of a cab in an elevator shaft. The measurement tape is designed with respect to its length such that it extends over at least two floors, wherein the measurement tape includes a marking unit having at least two markings for marking a position in the elevator shaft. The transmission device which is integrated into the measurement tape includes at least one communication line for transmitting an electrical or optical signal, in particular, a piece of information. The communication line runs along the length of the measurement tape. Instead of or in addition to communication lines, supply lines may also be provided which, for example, are used for supplying power to electric devices.

In addition, such a measurement tape includes a carrier tape, into which the lines, for example, are integrated. A design is also conceivable in which the measurement tape is designed as a composite material which includes, for example, a carrier tape for stabilization, in particular, in its center.

The connecting device according to the present invention is advantageously employed in order to enable access to the lines on individual floors or at another, basically any, position in the elevator shaft in which information may be gathered or fed in or a voltage may be tapped. It is characterized by a high level of flexibility, since access to the lines of the measurement tape is possible practically anywhere.

The connecting device according to the invention has at least one connecting contact for connecting to one of the communication lines and/or supply lines, wherein the at least one connecting contact is movably supported in the connecting device.

Specifically in the case of newly built houses, the effect of the structure "settling" over time generally occurs, that is to say the building becomes somewhat compressed over time owing to material loading, changes in the construction substance etc. In order to be able to take into account this structural effect from the start when installing an elevator in a building, position markings, for example, can be fitted to the elevator frame on which the cab is movably supported, since the frame is at least not directly affected by the process of "settling" of the building; in this case, the position of the markings relative to the elevator does not change. However, a procedure of this kind can entail the problem of the markings on the frame no longer corresponding to the actual positions of the individual floors in the building as soon as the building has settled. If, however, the measurement tape is not fixed to the frame, but rather in the elevator shaft, specifically simultaneously in such a way that it is fixedly connected to the elevator shaft continuously or at least at several points, the measurement tape can bend, deform or at least be subject to stress when the building settles.

For this reason, the measurement tape is movably mounted and generally fixed only to the ceiling of the elevator shaft. However, fixed contacts in principle form a further fixed connection to the measurement tape. Since, however, the contacts are advantageously themselves movably mounted, the contacts can advantageously follow the settling movement of the building, without the measurement tape being subject to stresses or having to bend.

In one specific embodiment of the present invention, the connecting device may establish a wired electrical contact. It may, for example, include a piercing contact for contacting a line in a piercing manner. Such a piercing contact generally initially cuts through or breaches the insulation of the contact line and then establishes an electrical connection to the electrically conducting wire of the line. It is also conceivable to employ a crimping device in which not only the insulation is breached, but a joining process is used for contacting, in which the contact with the wire is able to be established via plastic deformation. Both connection types are in particular advantageous, since the insulation is opened only at the corresponding point of contact. Although the wire itself is breached with a crimping device, a mechanically highly stable and reliable connection is able to be established in return, since good electrical contact may be ensured by the joining process.

It is also conceivable to employ a spring-loaded contact pin in one specific embodiment of the present invention. The spring tension enables a constant mechanical connection, it then being possible to use this connection type in particular if the line to be contacted is not surrounded by an insulating layer, but is, for example, formed as a conducting path in which simple mechanical contact (without plastic deformation) is sufficient. In particular, it is advantageously a nondestructive contacting element. It is reversible at any time by operating the spring, so that the contact pin may be moved to another position.

Wireless connections also become possible according to the present invention, for example, as inductive or capacitive connections. An inductive connection requires that the line to be contacted is not shielded at the corresponding position. A capacitive connection may also be established. For example, a capacitive coupling may be achieved via a kind of clamp or sheath which at least partially surrounds the line to be contacted. With a capacitive coupling, it is necessary for an insulator or a non-conductor/dielectric to be provided between the two capacitor plates, accordingly, the clamp or the sheath, and the wire on the other hand. These options also constitute connections in which the lines are not damaged.

However, it is also conceivable to provide a connecting plug or to provide male plug connections, which is then in particular advantageous if connection sockets are provided at regular intervals on the measurement tape. Depending on whether or not a line is live, it is accordingly possible to switch between a male or female plug connection. Furthermore, a connection test device may be provided at a certain position for testing the connection to at least one of the lines, which, for example, tests the continuity or checks optical signals which are generated if a plug connector has been correctly plugged in. As a result, rapid maintenance and upkeep and rapid testing may advantageously be carried out.

The connecting device according to the present invention or one specific embodiment of the present invention may be advantageously employed in a position determination device, in which the position of a cab is determined with the aid of the measurement tape in question. According to the present invention, it may, however, also be employed in a safety device which uses a transmission of safety-related data via the contact lines of the transmission device of the measurement tape. The safety device is used, for example, to influence the drive of the cab if malfunctions occur by, for example, blocking shaft doors or cab doors. All of this may be forwarded via the corresponding data lines to the safety device, so that it may also be available for tapping on each floor via the line of the measurement tape.

Such a safety device may in particular also use a testing device for testing the measurement tape for stretching of the tape or for cracks or breaks. The test may be carried out via a runtime measurement. Furthermore, it is possible to carry out capacitive measurements of the lines or even a simple continuity check. This allows for rapid maintenance. On the whole, however, the safety of such an elevator device is in particular increased.

It is also conceivable in an advantageous refinement of the present invention to provide a connection test device for testing the connection to at least one of the lines at a certain position, for example, at the level of certain floors, so that service and maintenance may also be carried out rapidly. For example, it may be provided to trigger of optical signals when contacting or to provide a continuity check at the corresponding position. Since the transmission device may generally also be used for communication, a communication device may also use the corresponding connecting device according to the present invention or one of its specific embodiments if it provides information transmission via the measurement tape.

Generally, corresponding peripheral devices, position determination devices, safety devices, or communication devices may be employed according to one of the exemplary embodiments of the present invention in an elevator device according to the present invention, all advantages in connection with the connecting device according to the present invention being available.

BRIEF DESCRIPTION OF THE DRAWINGS

Exemplary embodiments of the present invention are represented in the drawings. Both the measurement tape and corresponding connecting devices are depicted. They are explained in greater detail, specifying additional details and advantages.

FIG. 6 shows a parallel line routing in the measurement tape;
FIG. 7 shows a twisted line routing.

DETAILED DESCRIPTION OF THE INVENTION

Figure 1:
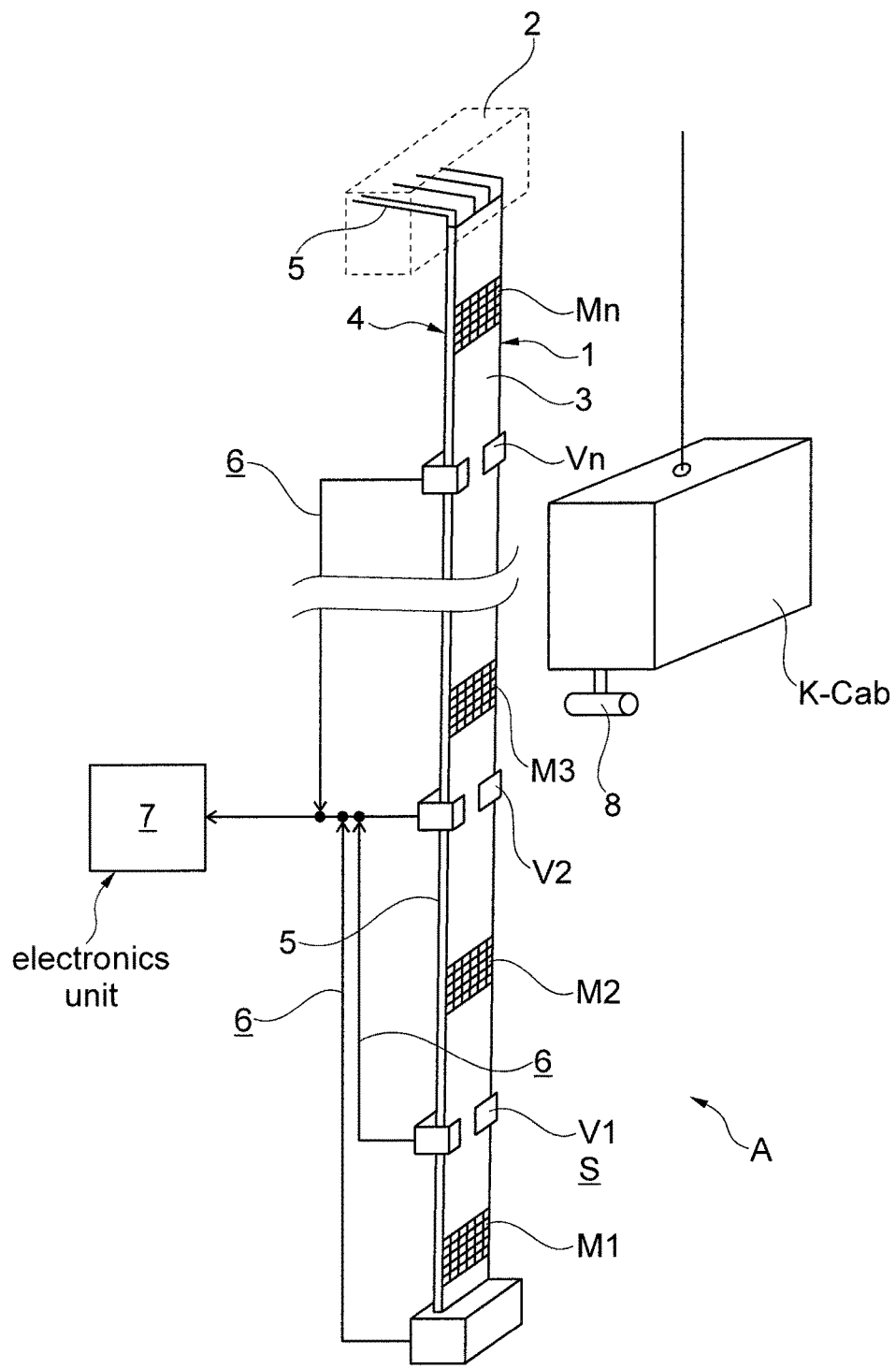
FIG. 1 shows a schematic representation of an elevator shaft having a measurement tape.

FIG. 1 shows an elevator device A having an elevator shaft S, in which a cab K is movably supported. A measurement tape 1 is situated in a suspended manner along the elevator shaft. The measurement tape 1 is fixed only at its upper end via an installation device 2. A marking unit having multiple markings M1, M2, M3, Mn is situated on the front side 3 facing the cab K. A reflective layer is situated on the front area 3 of the measurement tape 1 which extends longitudinally across the entire measurement tape 1. The markings M1, M2, M3, Mn are designed as imprinted 2D codes.

The markings M1, M2, M3, Mn are encrypted, so that a position determination device requires the specific key for decrypting/decoding these sensor-detected markings in order to be able to obtain this encoded data. In the present case, the position of the corresponding elevator cab K in the shaft S is marked via the markings M1, M2, M3, Mn. If the cab K is situated at a corresponding position and its sensor reads out, for example, the marking M2, the encoded position information on the marking M2 thus corresponds to the current position of the elevator cab K.

Communication lines 5 are situated on the rear side, i.e., the side 4 of the measurement tape 1 facing away from the cab K, via which information may be transmitted. These communication lines 5 run along the entire length of the measurement tape 1 from the top to the bottom. Connecting devices V1, V2, Vn are also situated at the level of the individual floors, i.e., one of these connecting devices V1, V2, Vn is situated at each floor. The markings M1, M2, M3, Mn do not have to be situated spaced apart from each other; rather, it is also conceivable for each marking to follow the preceding one directly. In fact, it may be advantageous to arrange the markings 'continuously' over the length of the shaft S or over the length of the measurement tape 1, so that the current position may be read out at each position.

In addition, it is conceivable that certain positions in the shaft are separately marked or encoded. For example, so-called 'safety zones' exist around each floor entry in the shaft or around each shaft opening. If the elevator must stop within one of these safety zones, for example, in an emergency, the doors may thus be opened even though the cab is not situated in the specified exit position of a floor (for example, with the cab floor flush with the shaft opening). In this emergency situation, an exit in the safety zone is possible and must therefore unconditionally be allowed by the safety device of the elevator, for example, by allowing the doors of the cab to be unlocked.

The connecting elements V1, V2, Vn have contacting elements to the communication lines 5. Lines 6 are continued to an electronics unit 7 via these contacting elements. In the present case, the electronics unit 7 is a safety device which, for example, monitors whether the elevator doors, for example, the shaft doors which are attached to the elevator shaft S or the cab doors on the cab K, are properly closed during travel or are open when exiting, or whether there is a malfunction caused, for example, by blockage of a door.

An optical sensor 8 is situated on the cab K, which is used for reading out the markings M1, M2, M3, Mn and which passes the obtained data to a position determination device.

Figure 2:
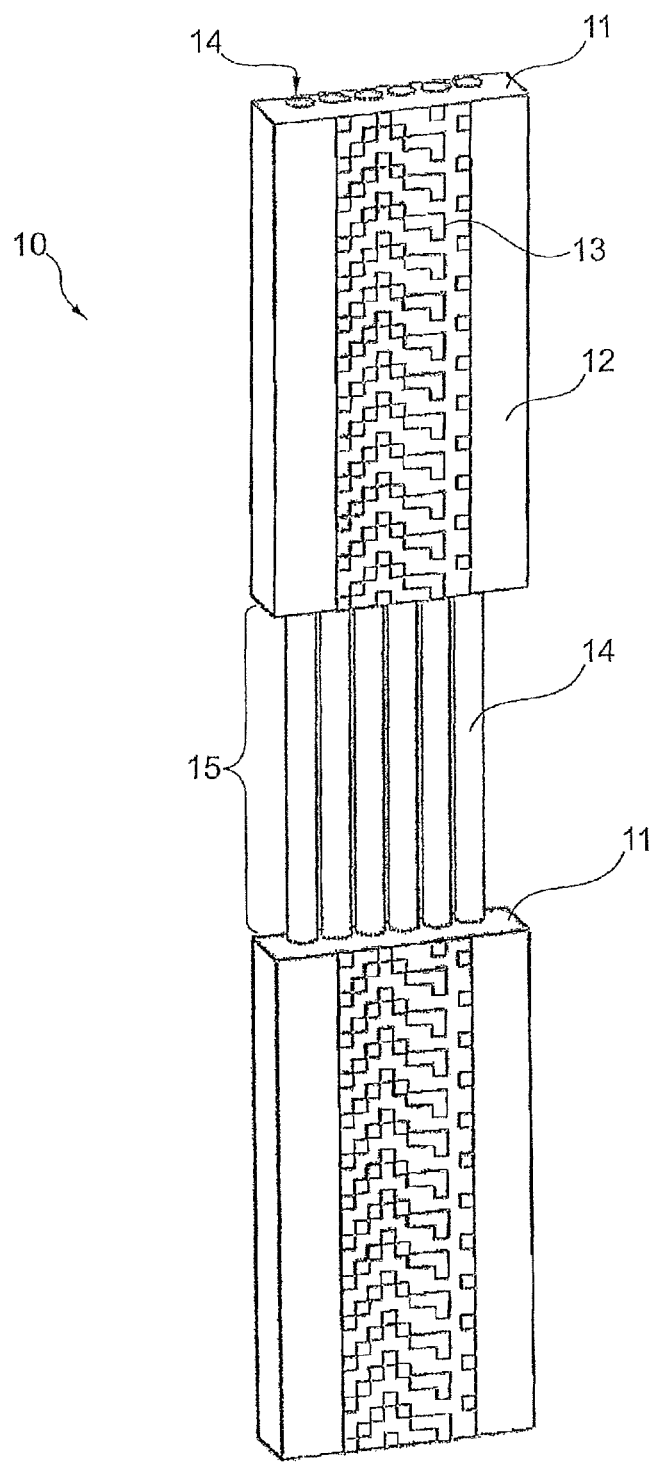
FIG. 2 shows a measurement tape having lines.

FIG. 2 shows a schematic representation of a measurement tape 10 having a carrier tape 11. The two side edges on the front side on the measurement tape 10 are left free, while a marking strip 13, which comprises a reflective layer having a 2D code imprinted on it as a marking, is attached in the center. The carrier tape 11 itself is designed as a steel tape. Communication lines 14 are embedded in the carrier tape 11 which are made up of electrically conducting wires which, however, are insulated with respect to the steel tape. In the specific embodiment according to FIG. 2, they run in parallel. For purposes of clarity, the lines 14 are illustrated without the carrier tape in the area 15. The side area 12 is therefore left free so that it may be partially enveloped there by the support without the marking strip 13 being covered. In order to be able to read out the markings or the 2D code 13, a corresponding encoding key must be stored in the position determination device.

Figure 3:
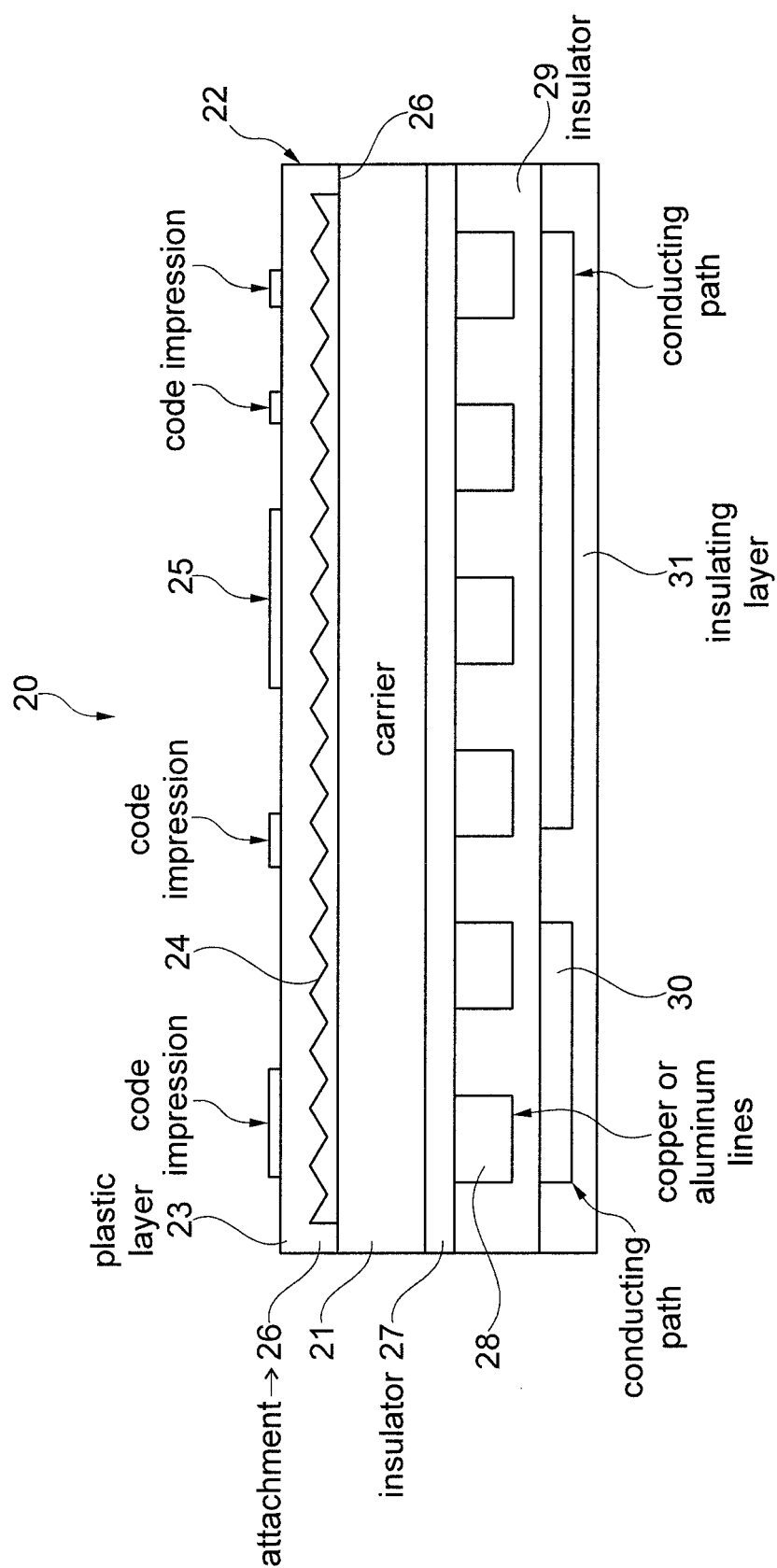
FIG. 3 shows a cross section of a measurement tape.

FIG. 3 shows a detailed representation of a structure of such a measurement tape 20. This tape 20 has a carrier tape 21 which is formed from steel as a basic component. The marking 22 is situated on the upper side of the carrier tape 21 in FIG. 3, which in turn initially has a transparent plastic layer 23 on the surface. A kind of air cushion 24 is situated between the major portion of the plastic layer 23 and the carrier tape 21. The plastic layer 23, which is generally made of polyester or polycarbonate, is formed in a serrated manner toward the air cushion 24. Code imprints 25 for encoding position information are in turn situated on the outer surface of the plastic layer 23. The plastic layer 23 is attached to the carrier tape 21 in the edge area 26. The air cushion 24 is necessary in order for light, for example, from an optical sensor of the elevator cab which passes through the transparent plastic 23, to be reflected back at the serrated border surface between the plastic layer 23 and the air cushion 24. On the other hand, if the light falls on a code impression 25, it is largely absorbed. In this way, the code is read out and recorded.

An insulating layer 27 is initially situated on the other side of the carrier. Copper or aluminum lines 28 are located directly at this insulating layer 27. These lines 28 are in turn covered by an insulator 29. The line 28 is thus embedded between insulators 27, 29. Imprinted conducting paths 30 are in turn situated on the insulator 29, which in turn is covered by an insulating layer 31. The measurement tape thus includes a reflection strip on its marking side, only some areas which display an encoding being covered by black areas (imprinting) for marking. It may be advantageous to provide only one center strip with the markings on the marking side of the measurement tape along the length of the measurement tape and to leave the side areas at least partially free. This measure is advantageous because the measurement tape is for the most part not rigidly fixed at regular intervals, but is suspended in the upper area of the shaft and is otherwise movably supported. This support may advantageously be carried out by a partial enclosure, so that the code tape is enveloped at the edges; however, the enclosure does not completely surround the measurement tape, but leaves an open gap. For reasons of symmetry, this gap may therefore lie in the center of the measurement tape.

When new buildings are built, the effect of 'settling' becomes noticeable over time, i.e., their height decreases slightly over time. If the measurement tape were fixed at regular intervals, it would bulge out in a wavelike manner if the height of the building is decreased or compressed. However, if the measurement tape is movably supported, it is able to move within the supports, and the support does not have to be opened, and the measurement tape also does not have to be readjusted. The predefined edge areas may, for example, be used for individual markings, for example, for marking safety zones, around each floor exit, particularly as, in this case, no continuous, unbroken marking is required, which could be covered by a support.

The reflection may be achieved using rear reflectors in the reflection tape, for example, also via small specular spheres or via the arrangement of prisms. The attachment of curved mirrors is also generally possible.

The carrier material 21, which is formed mainly from steel, ensures high mechanical stability on the one hand. In addition, it may also be glass-fiber-reinforced or carbon-fiber-reinforced. This reinforcement is in particular advantageous because the very long measurement tape may also have a non-negligible weight and may therefore also stretch once more over time. This stretching of the measurement tape may thereby be reduced. On the whole, however, the measurement tape must in any case be able to withstand several loads in the elevator shaft S; in particular, on the one hand, the temperatures and temperature differences prevailing there, the humidity, the dust, corrosion, particularly due to humidity, mechanical abrasions, and wind. The individual layers, imprints, and so forth may be attached together in a wide variety of ways, for example, by laminating, gluing, soldering, welding, or by other methods for forming a connection. In particular, layers or markings may also be imprinted.

Figure 4:
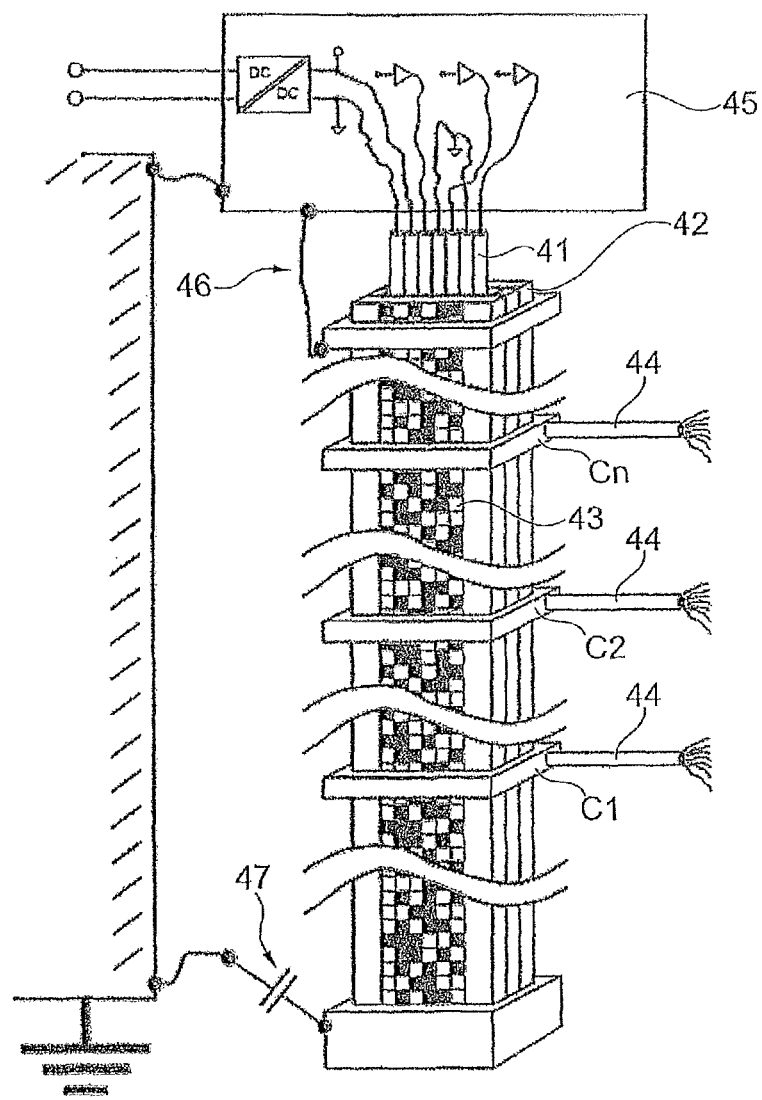
FIG. 4 shows a measurement tape having ground terminals and an anti-interference capacitor.
Figure 5:
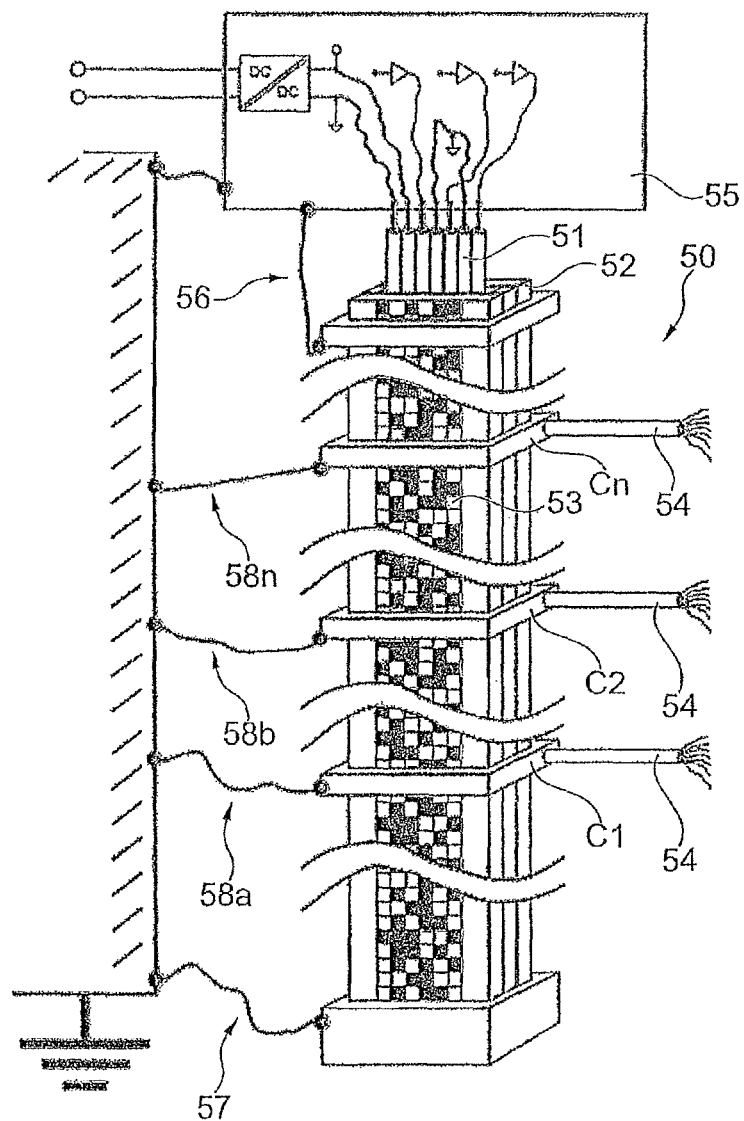
FIG. 5 shows a measurement tape having ground connections.

FIGS. 4 and 5 show options for establishing grounding or producing shielding. FIG. 4 shows a schematic representation of a measurement tape 40 having communication lines 41. A metal cage 42 is situated in the outer area, which encloses the measurement tape along with its lines 41. In addition, a marking strip 43 is provided. A connection clip C1, C2, Cn is situated at the level of each individual floor, which simultaneously provides contacting elements to the lines 41, so that corresponding connection lines 44 may each be routed from the clips C1, C2, Cn. The communication lines 41 may be arranged in parallel or twisted in pairs in order to achieve shielding. In the case of lines arranged in pairs, a ground cable is situated between each of the individual communication lines. The communication lines are in turn galvanically isolated from the electronics with which they are connected via the line 44. The communication lines 41 are also connected to other electronics in the upper area of the elevator shaft via galvanic isolation 45. The metal cage is grounded at the upper end of the measurement tape via a ground line 46. The metal cage is connected to ground in the lower area via a capacitor 47. The capacitor 47 is also referred to as an anti-interference capacitor. This capacitor 47 constitutes a kind of bypass for discharging high-frequency oscillations, since the measurement tape 40 could act as an antenna without an anti-interference capacitor.

FIG. 5 shows a similar measurement tape 50 having communication lines 51, a metal cage 52, and individual clips C1, C2, and Cn for contacting the lines 51. Furthermore, a continuous marking 53 is attached in the outer area along the length of the measurement tape 50. The contacted lines 51 are routed outwardly via cables 54 and connected to additional electronics via the clips C1, C2, Cn. The lines 51 may also be arranged in parallel with ground cables between them for shielding or else twisted in pairs so that no internal crosstalk results; i.e., the lines do not mutually influence one another when conducting signals. In the upper area, the communication lines 51 are in turn connected via galvanic isolation 55 to additional electronics and to a voltage source if lines for supplying power are provided within the lines 51.

In the present case according to FIG. 5, a ground of the outer metal cage 52 is provided via a ground connection 56 not only at the upper end of the measurement tape 50, but also in the end area among other places, in particular via the line 57. Anti-interference capacitors are not provided. However, in order that no transient currents flow because the ground is attached at different locations of the measurement tape, which in turn are far apart, a ground is provided at each clip C1, C2, Cn at the level of each floor via the corresponding lines 58*a*, 58*b*, 58*n*.

FIG. 6 shows multiple communication line cables and current conduction cable pairs 61, 62, 63, which are situated in parallel along the length of the measurement tape and are shielded from each other by ground cables 64, 65, 66, 67. In addition, a cover 68 is attached above the individual cables, which may also be metallic and is connected to ground in order to achieve shielding. A slot 69 is situated at one position in this cover 68, in the area of which contacting or access is thus directly possible.

FIG. 7 shows a similar arrangement of cable pairs 71, 72, 73, wherein the respective pairs 71, 72, 73 are twisted together, thereby achieving shielding. In addition, ground cables 74, 75, 76, 77 are situated between the individual pairs 71, 72, 73. A grounded cover 78 is also situated over the cables having an opening 79 via which contacting may take place.

Figure 8B:
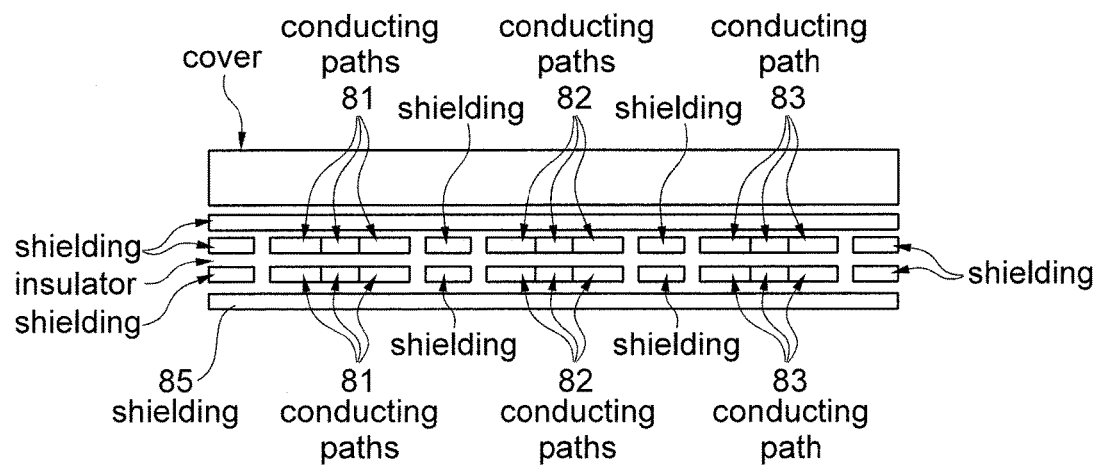
FIG. 8b shows meandering conducting paths (top view)
Figure 8A:
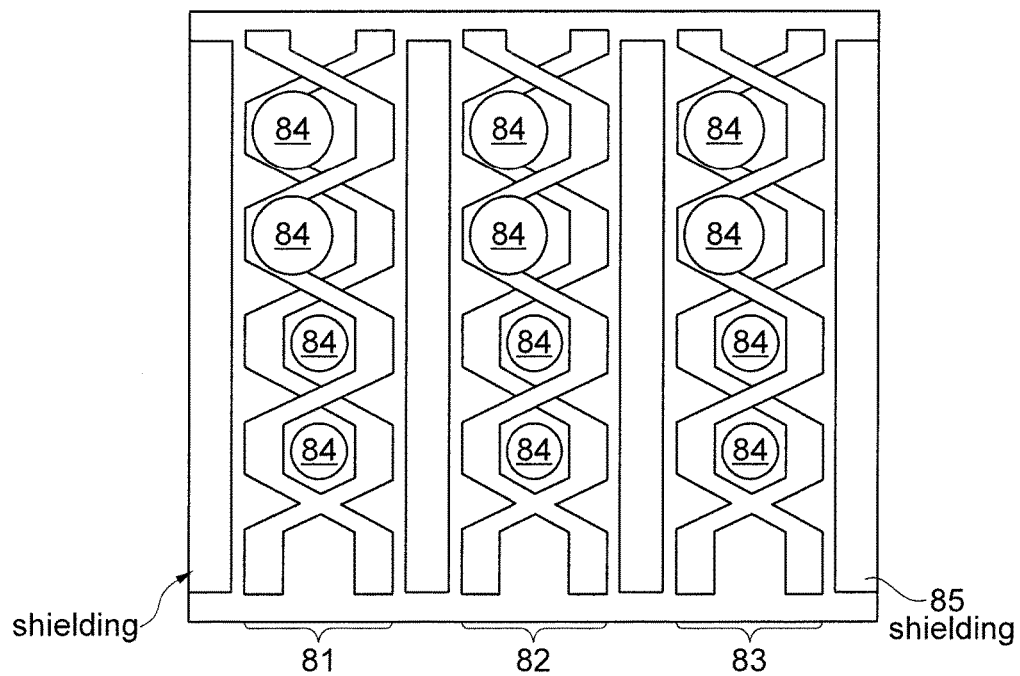
FIG. 8a shows meandering conducting paths.

FIGS. 8*a* and 8*b* also show line pairs 81, 82, 83 which are formed (for example, imprinted) as conducting paths. Similarly to a twisted arrangement according to FIG. 7, these conducting paths 81, 82, 83 are arranged in a meandering manner. The conducting paths may be printed in such a way that they cross each other in a meandering manner. Different conducting paths may be situated directly side by side or lie one above the other in different layers. The twisting of conducting paths may be carried out in such a way that, in the case of three conducting paths, they are twisted together similarly to a braid, so that two different conducting paths demonstrate a kind of outward bulge in the longitudinal direction, and a contacting option 84 (to the central conducting path) is created in the center. The conducting paths may in turn be surrounded and shielded by a grounded cage 85 in the outer area. FIG. 8*b* shows a similar representation of a cross section of a corresponding measurement tape, in a top view.

The corresponding conducting paths may generally be contacted via so-called 'VIAs'.

Figure 9:
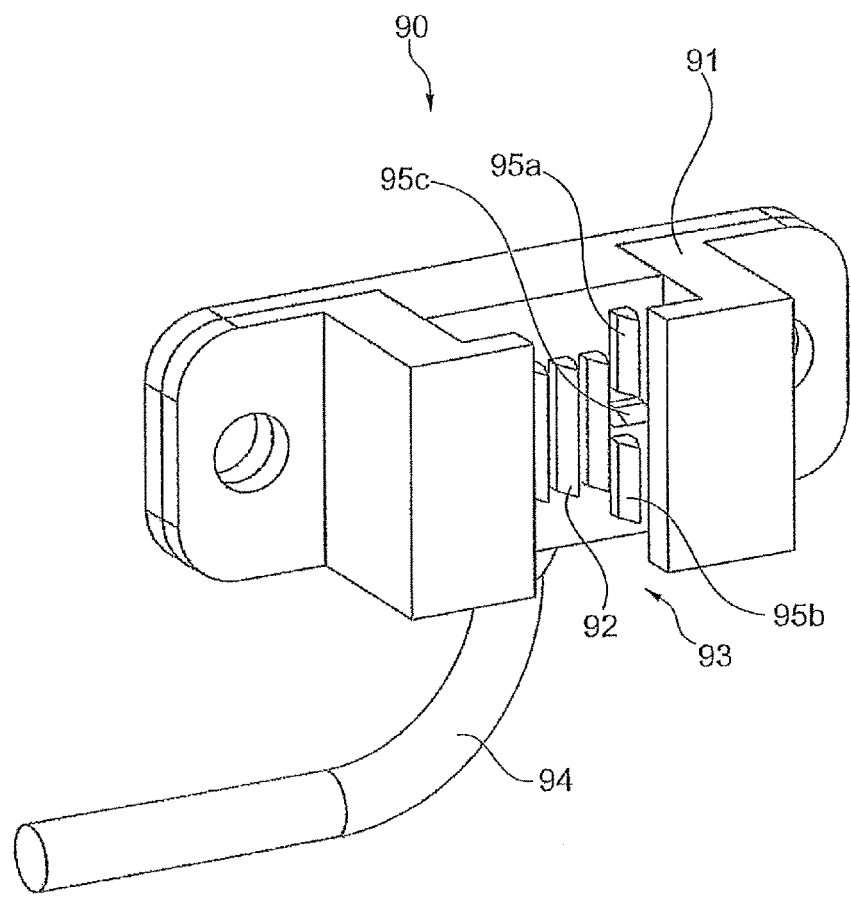
FIG. 9 shows a connecting device having an interruption contact.

FIG. 9 shows a connecting device 90 having an outer bracket device 91 which is able to be screwed onto the shaft wall, which is able to engage partially around the measurement tape, and furthermore having contacting electrodes 92 which are formed as piercing contacts. The bracket 91 has an opening 93 which makes it possible for the markings which are attached to one side of the measurement tape to be read out by an optical sensor on the cab. The contacts 92 are routed outwardly via a cable 94, for example, to the electronics of a safety device. The connection contacts 95*a*, 95*b* are also formed as piercing contacts. The blade 95*c* is an insulator severs the electrical line of the measurement tape. Contacting thus takes place before and after the interruption via the piercing contacts 95*a*, 95*b*. They are connected to safety electronics and bridge the interruption during normal operation. An interruption thus actually occurs only in the event of a corresponding defect. This interruption causes a disconnection in the safety circuit, resulting, for example, in the drive of the elevator being interrupted. It is thus a fail-safe circuit for increasing safety.

Figure 10:
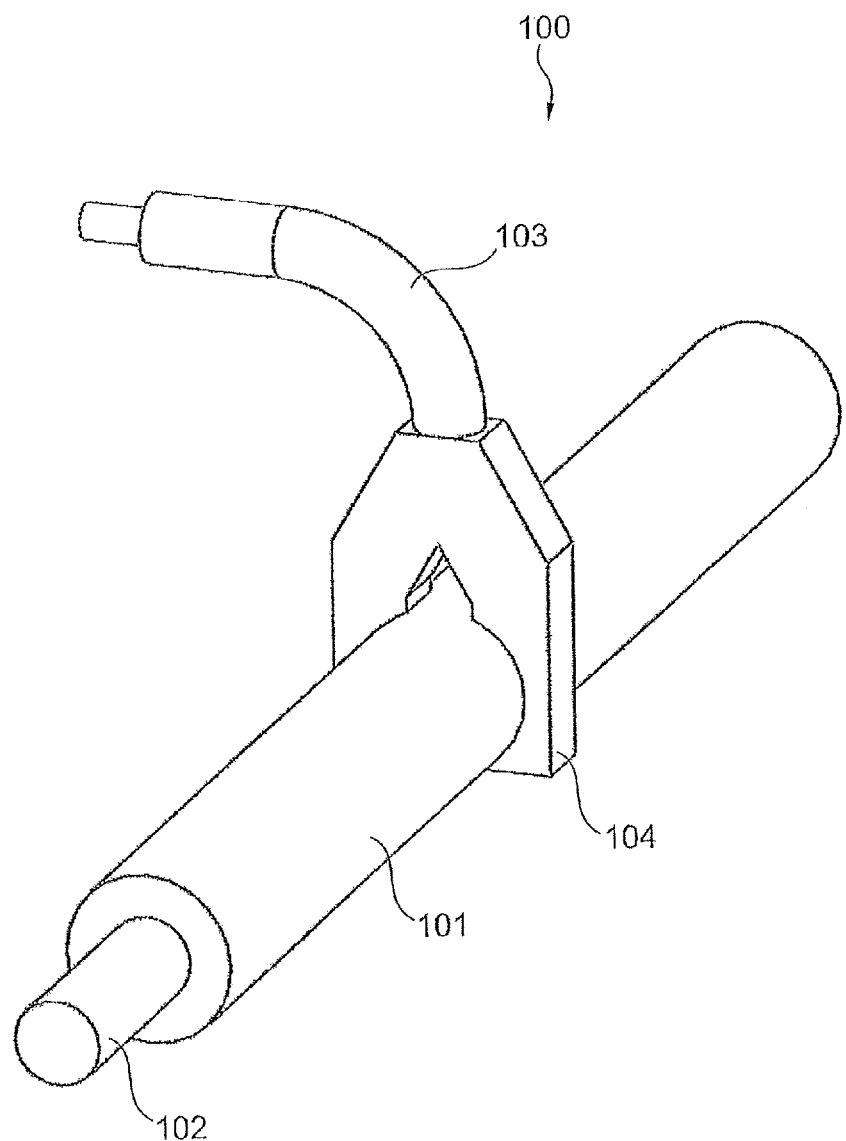
FIG. 10 shows a crimping device.

FIG. 10 shows a contacting option. A communication line 100 which is situated along a measurement tape is depicted initially. It comprises insulation 101 in the outer area and a conductor wire 102 which is situated in the center of the line 100. To connect the wire 102 to a cable 103, a piercing contact 104 is attached to the cable 103 whose cutting edges are able to sever the insulation 101, and also partially penetrate the material of the wire 102 at least in the edge area. As a result, a particularly stable and reliable electrical connection is established.

Figure 11:
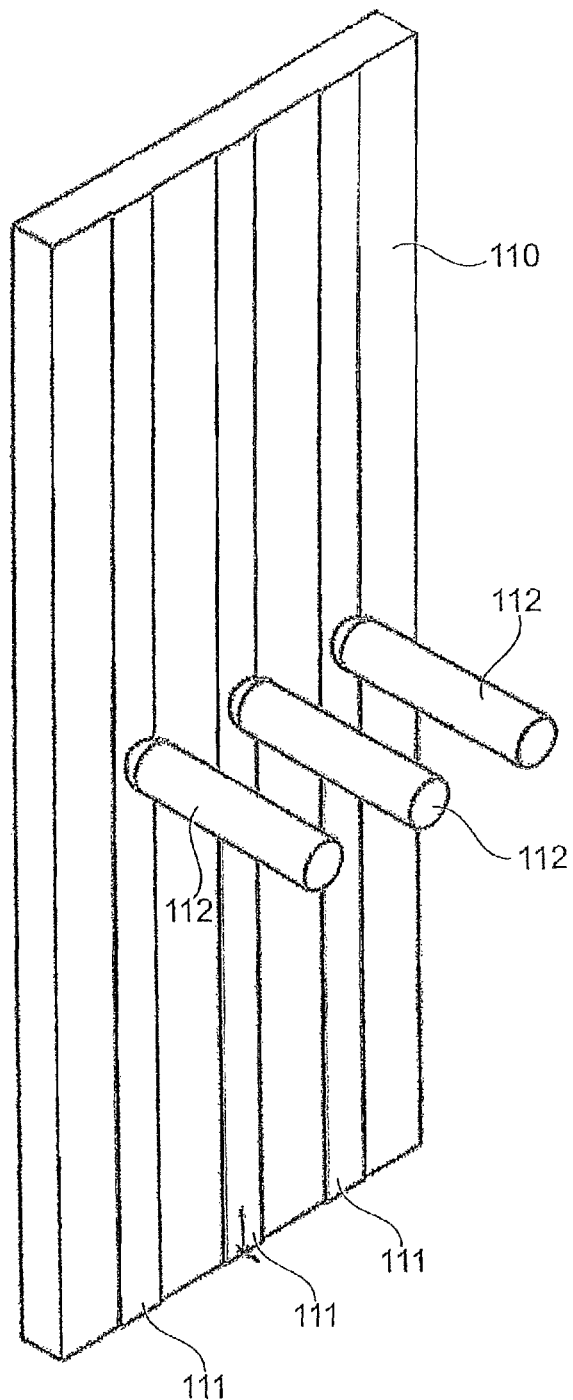
FIG. 11 shows spring-loaded contact pins.

FIG. 11 shows a measurement tape 110 on which conducting paths 111 are imprinted. They are contacted via spring-loaded contact pins 112. These pins thus receive a contact force via a pressurized spring which ensures that a stable contact is established between the pin and the conducting path 111.

Figure 12:
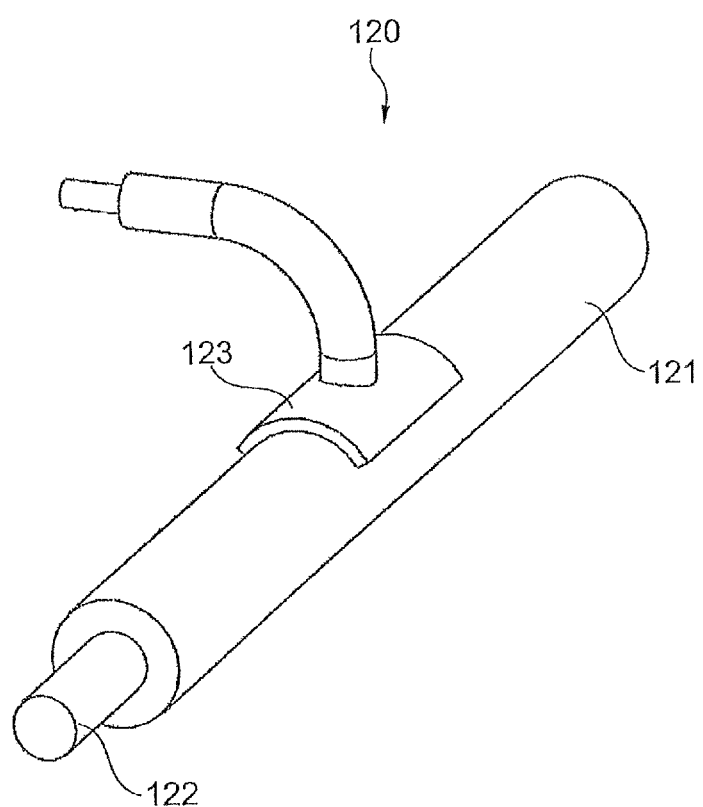
FIG. 12 shows a capacitive connection.
Figure 13:
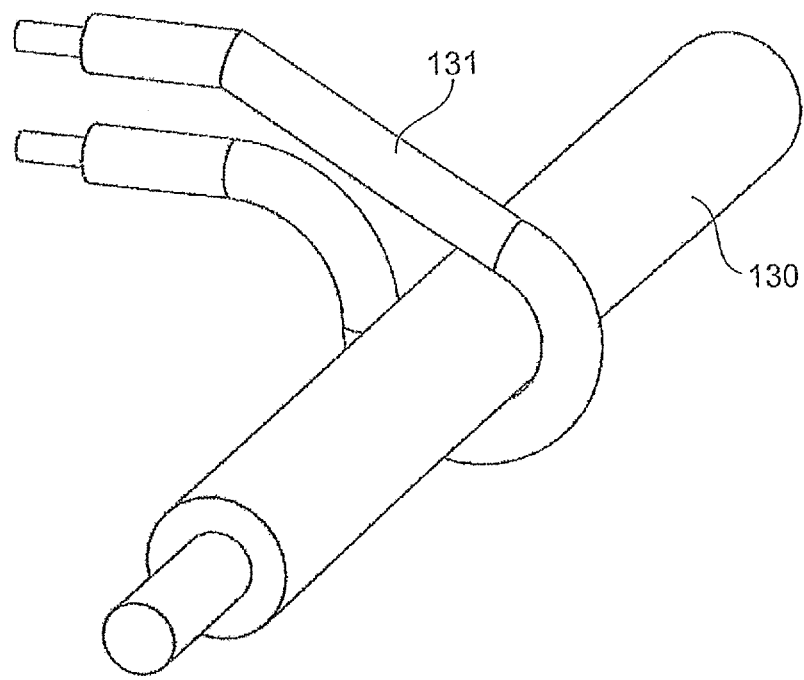
FIG. 13 shows a single-loop inductive connection.
Figure 14:
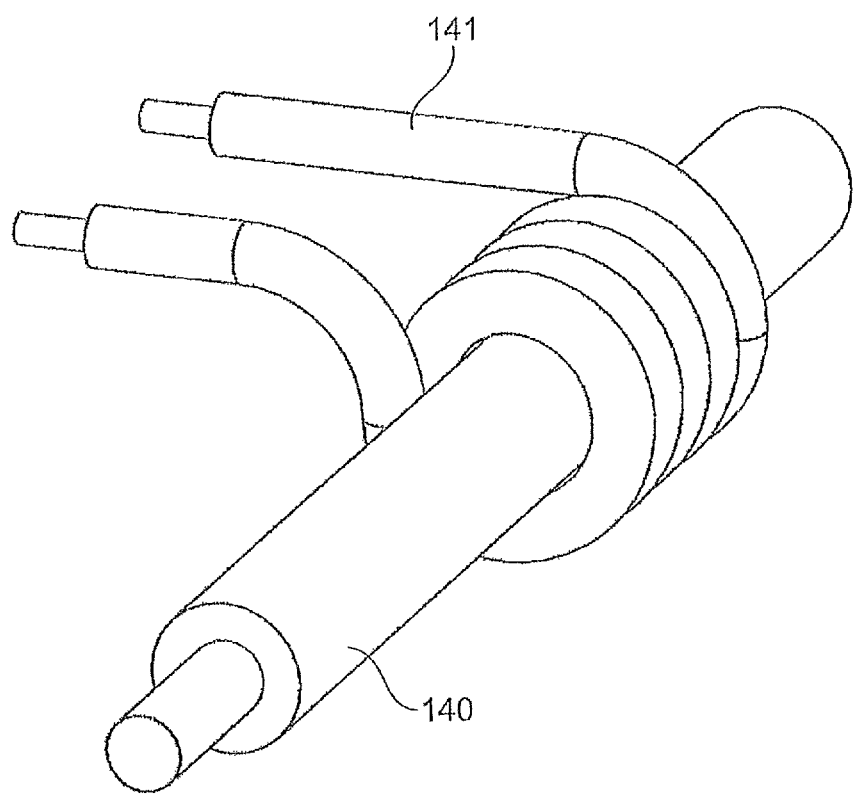
FIG. 14 shows a multiple-loop inductive connection.

In addition, there are, for example, options to establish a wireless connection. FIG. 12 shows a capacitive connection of a line 120 to an insulator 121 and a line wire 122. A kind of clamp 123 is provided in the outer area of the insulation 121 which partially circles the line 120. The clamp 123 thus acts as a capacitor plate, so that a capacitive connection is produced between the clamp 123 and the wire 122. FIGS. 13 and 14 depict inductive couplings in that the line 131 is wound around the line 130, and the line 141 is wound around the line 140.

Figure 15:
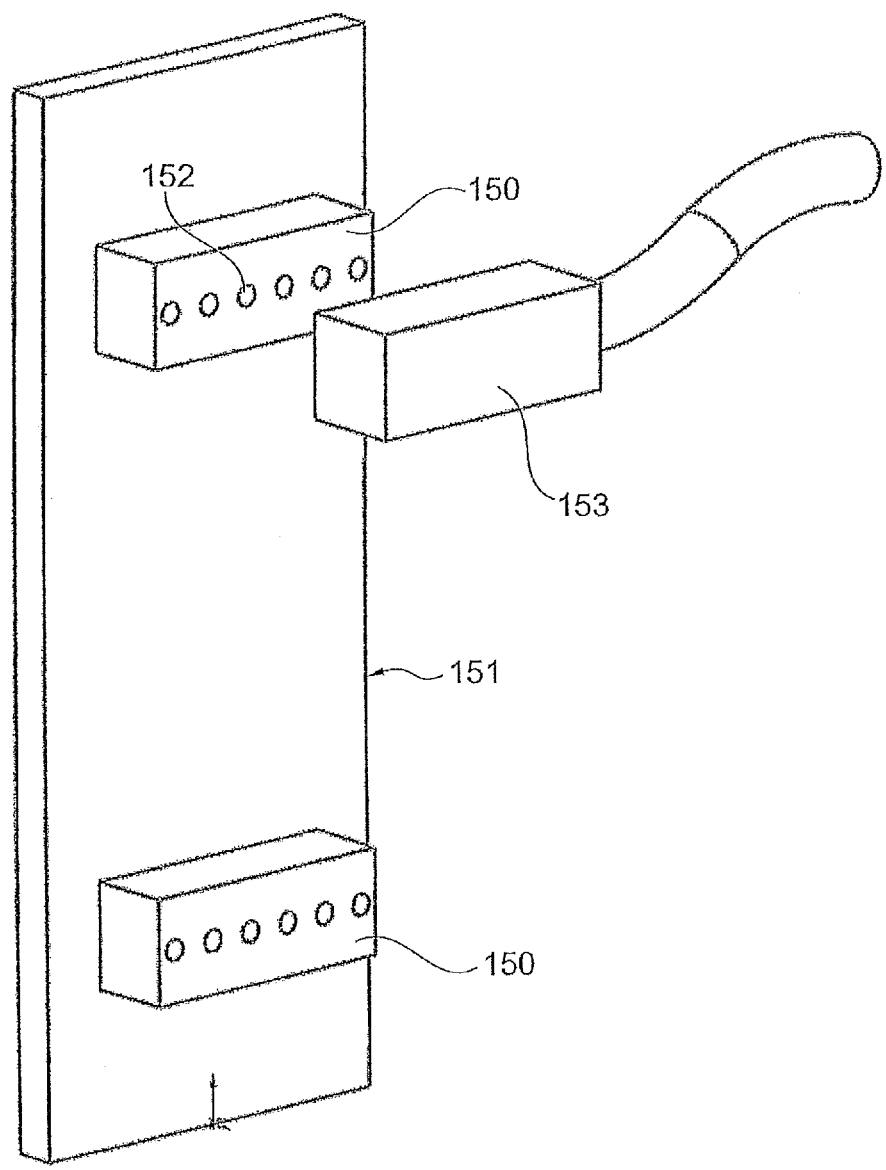
FIG. 15 shows a plug contacting element on the measurement tape.

A particularly elegant connection is depicted in FIG. 15. In a similar way, regular openings for contacting may be provided in the ground cage, it is also possible to arrange prefabricated sockets 150 at regular intervals, for example, at two-meter intervals. It is also conceivable to attach them at each floor. Each individual line in a measurement tape 151 is contactable via these sockets 150, since each female connection 152 is already precontacted to a corresponding line in the measurement tape 151. Another plug 153 is then required for contacting which may be plugged in at the corresponding position. The sockets 150 may possibly have a cover which is removable or is hinged, in the event that they are not required and thus must be protected from dirt. However, for the stability of the tape, such sockets 150 also have the advantage that they are in particular able to protect against torsion along the longitudinal axis. The socket 150 may be designed in such a way that it, for example, may be detected by an optical camera system of the cab, for example, by having the corresponding marking units itself. In addition, other optical indicators, for example, light-emitting diodes (LEDs) may be present which indicate whether a connection plug 153 is plugged into one of the corresponding sockets 150. A separate address may be assigned to each socket 150. The socket may be clamped, glued, soldered, screwed, clipped, or connected in another way to the measurement tape.

Figure 16:
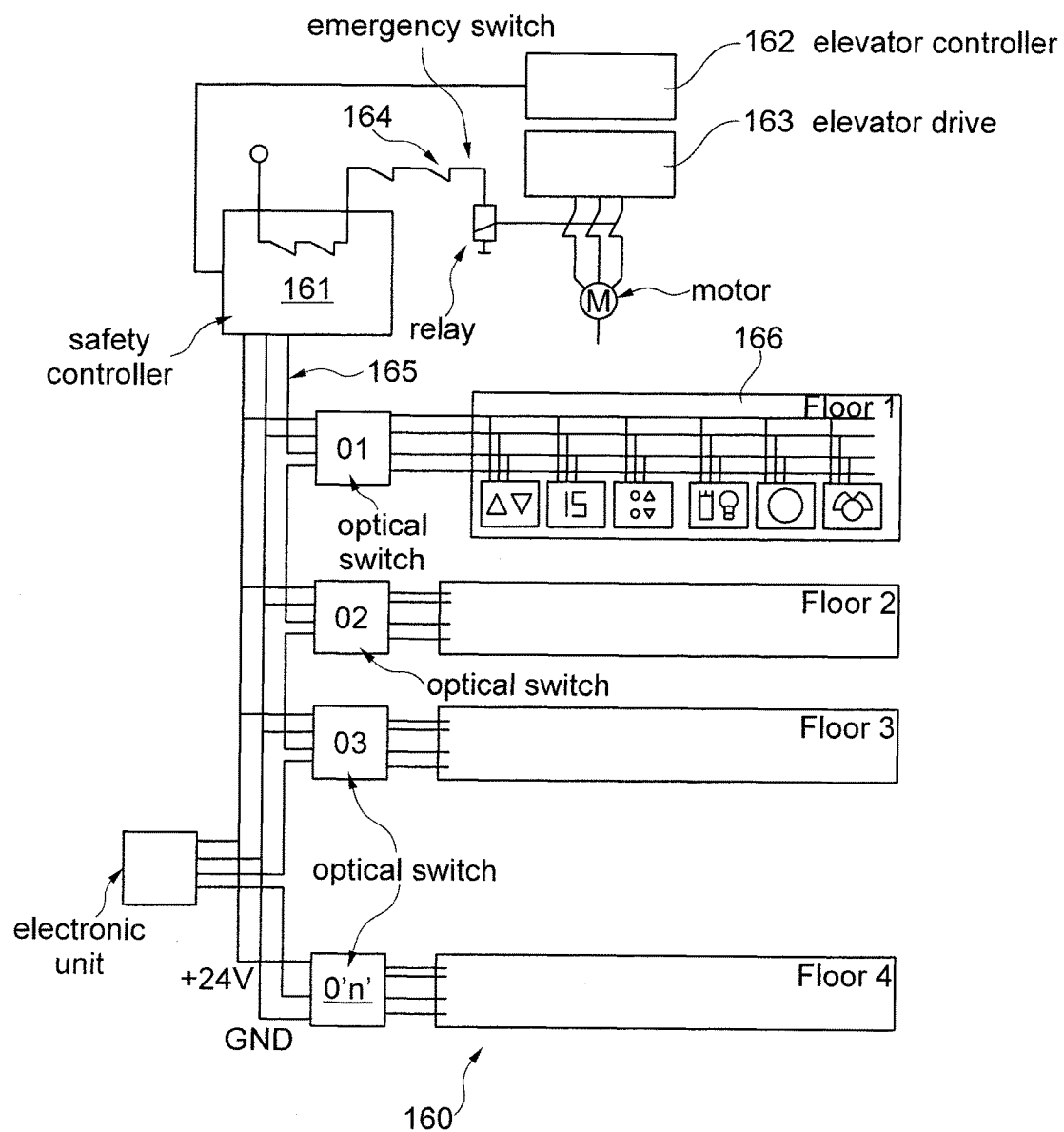
FIG. 16 shows a safety system having a bus.

FIG. 16 shows, for example, a corresponding safety device 160 which has a safety controller 161 which is connected to the elevator controller 162 and thus is able to directly control the drive of the elevator 163. In particular, the safety controller 161 is able to directly switch off the drive of the elevator via an emergency switch 164. An optical switch O1, O2, O3, On is provided to each floor which, for example, may be connected to other components via a bus line, for example, using position information or using operating switches of the elevator. Each optical switch O1, O2, O3, On indicates whether, for example, a shaft door is opened or closed. These corresponding bus lines, as well as power lines and ground lines 165, may correspondingly be routed over all the floors via a measurement tape according to the present invention.

Figure 17:
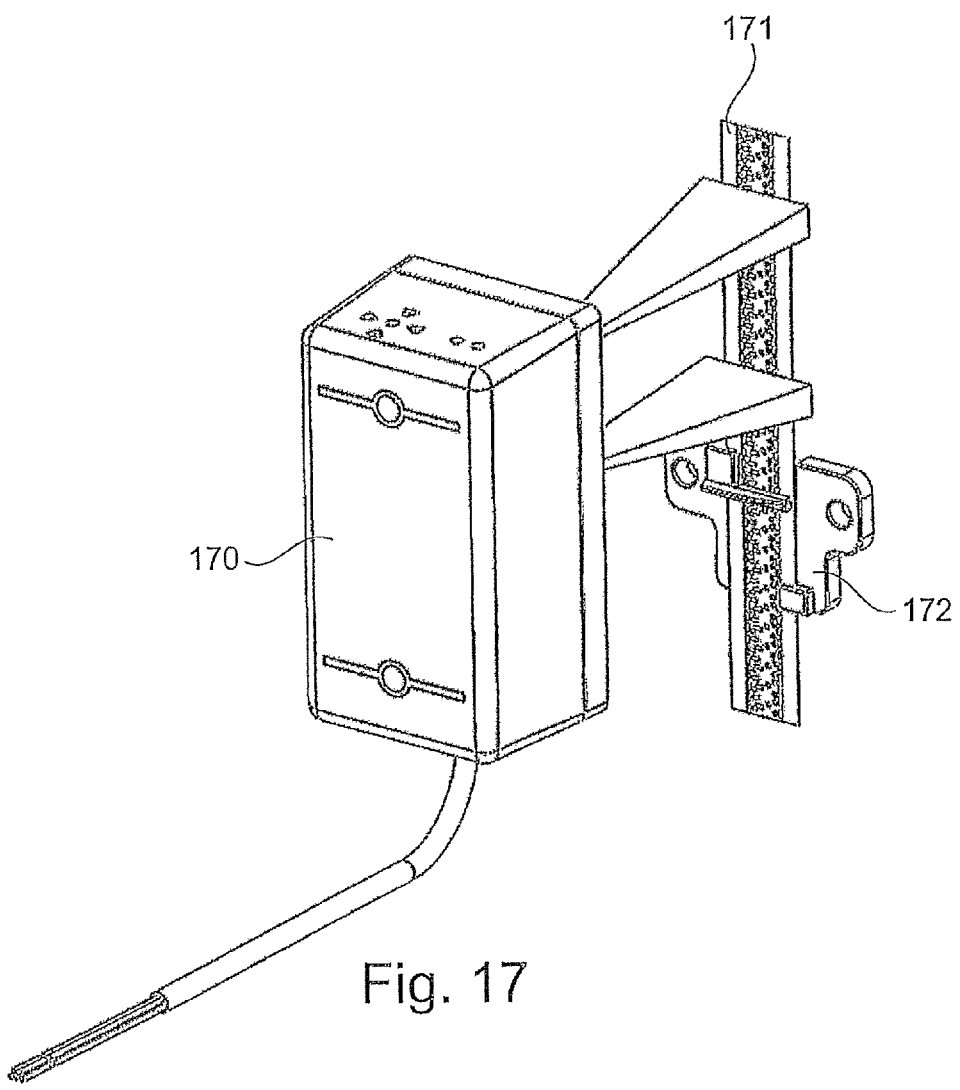
FIG. 17 shows a position sensor on the cab when reading out a measurement tape/code strip.
Figure 18:
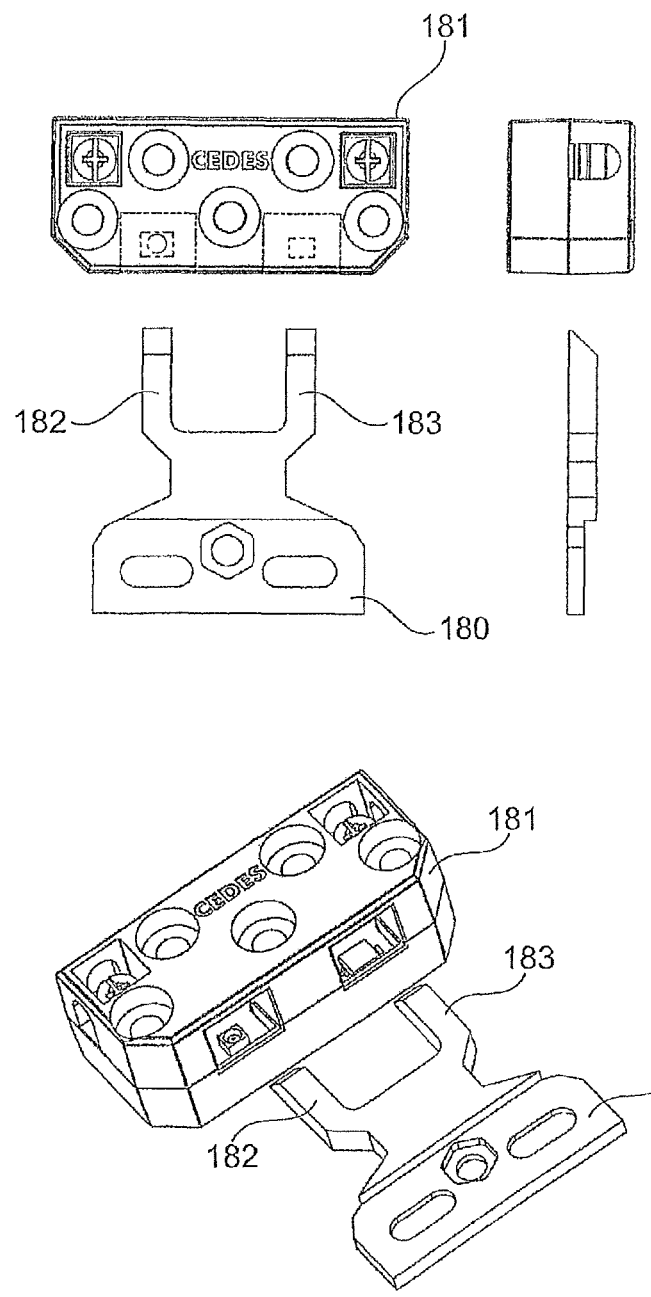
FIG. 18 shows an optical switch.

FIG. 17 shows a sensor 170 situated on a cab, which comprises a light source and an optical receiver, by which a measurement tape 171 which carries a marking may be read out. In addition, a support 172 for the movable support of the measurement tape 171 is visible. The optical switches shown in FIG. 16 are once again depicted in greater detail in FIG. 18. When closing a contact, a contact bridge 180 engages with the corresponding slot of a main element 181. The two legs 182 and 183 of the optical bridge 180 respectively constitute a light transmitter and a light receiver, while an optical conductor is situated in the main element 181, so that optical conduction from 182 to 183 may occur only if the bridge 180 correctly engages with the device 181. The switch is 'closed' only under this condition, which, for example, means that it may be determined with certainty that a door on an elevator is actually closed.

Figure 19:
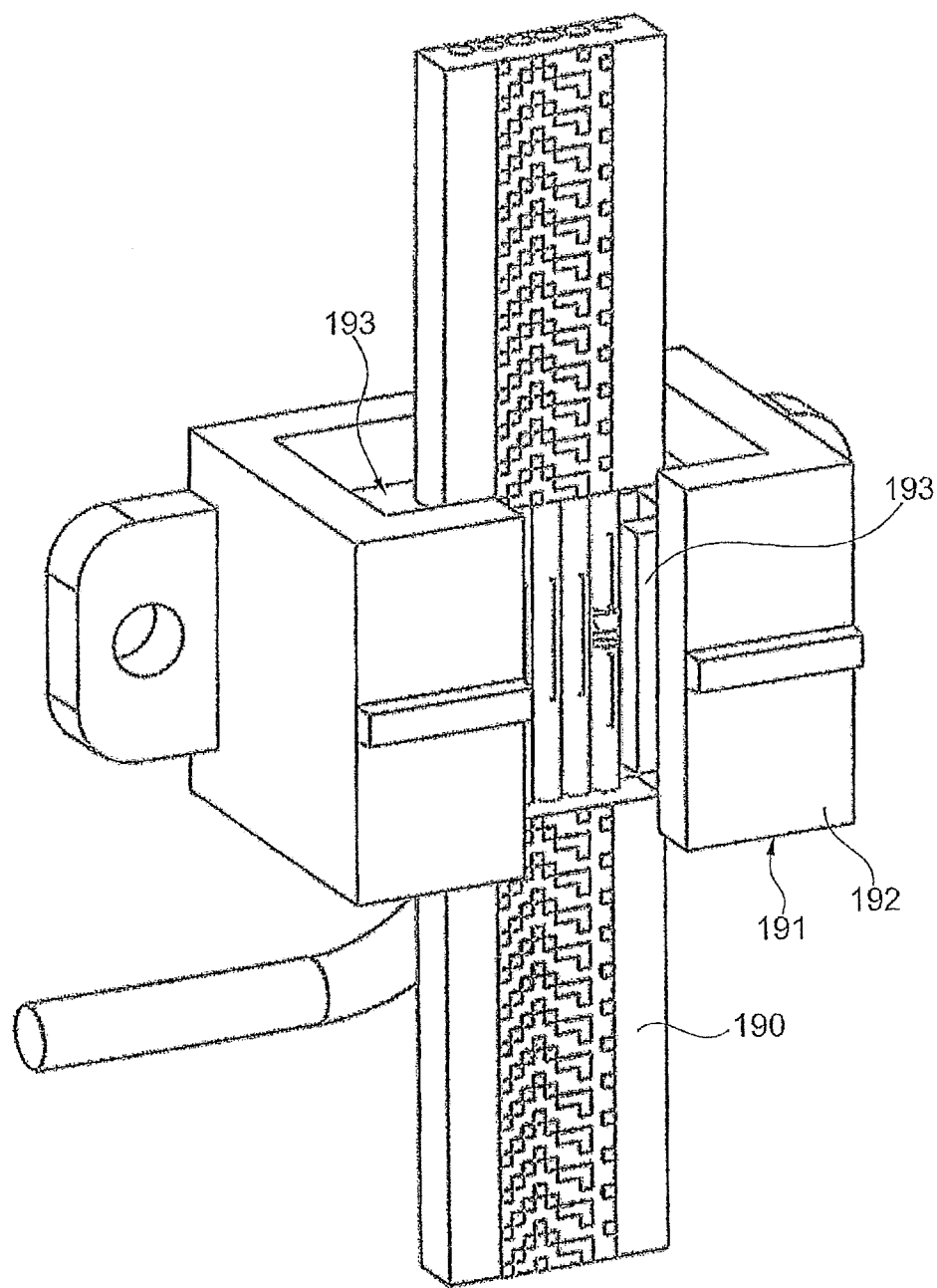
FIG. 19 shows a connecting device having a moving contacting element.
Figure 20:
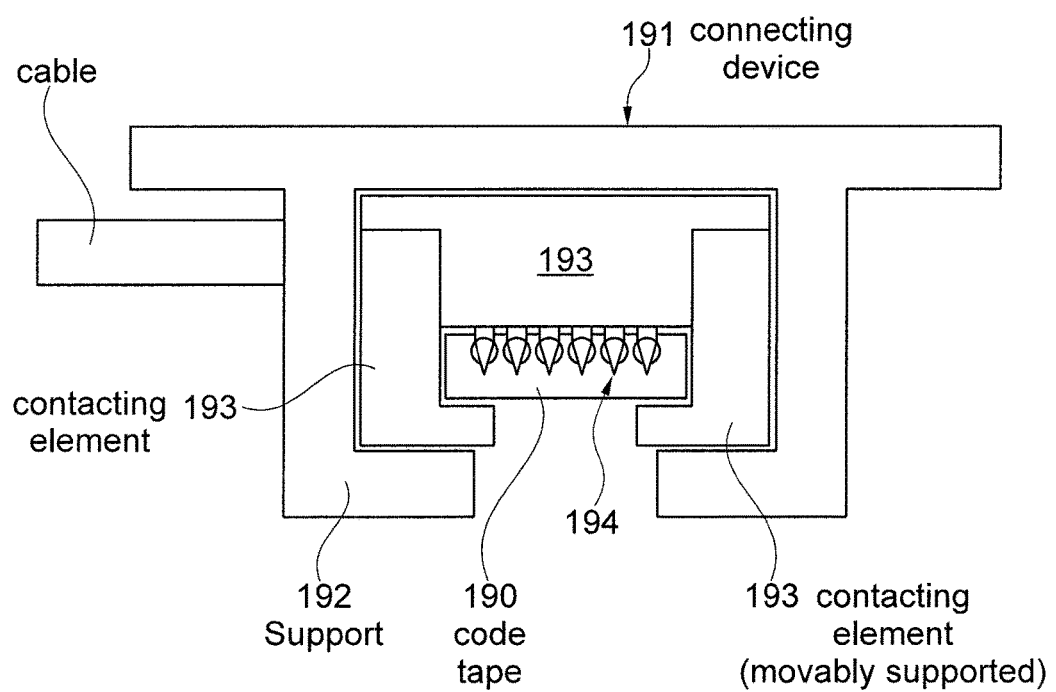
FIG. 20 shows a connecting device having a moving contacting element (top view).

FIG. 19 shows a measurement tape 190 having a connecting device 191 having a contacting device 193 which is movably supported in a support 192, via which the lines in the measurement tape may be (firmly) contacted (via piercing contacts 194), whereby building changes caused by the settling of the building over time may be detected. The measurement tape 190 moves relative to the shaft wall and takes the contacting device 193 with it, and thus moves relative to the shaft wall and hence the support 192. FIG. 20 shows a top view of the device according to FIG. 19.

In additional specific embodiments, it is conceivable that the connecting device may lie over the marking and covers it, in particular, if the connecting device itself is provided as a marking unit and contains information which, for example, is attached to its outer side. In particular, this may be position information. Various transmission options are conceivable for information transmission and communication. In particular, various bus systems may also be employed. Both a unidirectional and a bidirectional communication bus are conceivable.

It is also conceivable to arrange wires having a low ohmic resistance along the measurement tape by either using metals which are highly conductive, or by using wires having a large cross section. This measure may be advantageous in particular if the wires are used for supplying power, since the wires then have a lower inherent resistance and the losses are lower.

The number of lines may be chosen variously, for example, 2, 5 or even more. Two lines may be used for supplying power and constitute taps of a voltage source, at least one line may be provided as ground, and two additional cables may be used for communication. At least one of the wires may be advantageously connected to a safety device. A CAN bus or an RS-485 bus may be used as a bus system. The main power lines may also be used for communication if the signals are modulated. The modulation may be modeled on AM, FM, ASK, FSK, PSK, QPSK, QQPSK, M-PSK, pi/4-PSK, MSK, GMSK or other modulation methods. Communication may generally be carried out by analog or digital means.

The twisted line pairs for shielding may, for example, have an impedance of 100 ohms.

In one particularly preferred specific embodiment, a first layer is present which protects the surface from dirt, scratches, or other mechanical effects and includes an imprinted code for determining the position. Behind it is situated a layer which is transparent to infrared, which as a whole acts as a reflector (in that the corresponding surface on the side facing them has a reflecting boundary surface layer). The entire measurement tape or code tape has a carrier tape which is made of metal or a reinforced material in order to ensure mechanical stability. The degree of reinforcement and the kind of reinforcement depend on the length of the measurement tape. The lines are designed as cables and are twisted together in pairs, so that shielding may be achieved in this way. In addition, metallic casings or casings conducting in another manner are provided. Layers which are used for mechanical reinforcement may also be used for shielding or, for example, as carriers for the imprinted position code or as reflective layers. The different layers are laminated to each other or glued together.

In total, five lines are used in the preferred specific embodiment of the present invention: two for supplying power, two for communication (not for a safety device, but for other communication), and a bus line. The bus line is used by the safety device together with the ground line. Even greater stability may be achieved via another additional ground line. In such a specific embodiment, it is also conceivable to use conducting paths which may be imprinted, instead of wires. These conducting paths are thus not twisted together, but are arranged above one another in a meandering manner, so that a shielding effect may be achieved.

The connection to each of the individual lines is established via gold contacts which, for example, are crimped through the insulation. The twisting of the wire pairs is carried out in such a way that it periodically results in the same pattern approximately every two meters, so that the connections regularly match at corresponding positions with a particular degree of certainty. The connection sockets are clamped to the measurement tape and are connected to the safety system and other auxiliary devices.

The measurement tape is grounded only at one position. An anti-interference capacitor is situated on the other end of the measurement tape so that the measurement tape does not act as an antenna. The safety bus runs via an analog line, power and voltage modulation being carried out. All other devices and auxiliary devices are implemented via the two lines provided for other communication.

LIST OF REFERENCE NUMBERS

A Elevator device
S Elevator shaft

K Cab
M1 Marking
M2 Marking
M3 Marking
Mn Marking
V1 Connecting devices
V2 Connecting devices
Vn Connecting devices
1 Measurement tape
2 Upper suspension
3 Marking side
4 Line side
5 Communication lines
6 Data lines
7 Electronics unit
8 Optical sensor
10 Measurement tape
11 Carrier tape
12 Side area
13 Marking strip
14 Lines
15 Section of the inner area
20 Measurement tape
21 Carrier
22 Reflector
23 Plastic layer
24 Air gap
25 Code impression
26 Attachment
27 Insulator
28 Copper or aluminum line
29 Insulator
30 Conducting path
31 Insulating layer
40 Measurement tape
41 Line
42 Metal cage
43 Marking
44 Line
45 Galvanic isolation
46 Ground cable
47 Anti-interference capacitor
C1 Clip
C2 Clip
Cn Clip
50 Measurement tape
51 Line
52 Metal cage
53 Marking
54 Line
55 Galvanic isolation
56 Ground cable
57 Ground cable
58a Ground cable
58b Ground cable
58n Ground cable
61 Conductor pair
62 Conductor pair
63 Conductor pair
64 Ground cable
65 Ground cable
66 Ground cable
67 Ground cable
68 Grounded cover
69 Opening
71 Line pairs
72 Line pairs
73 Line pairs
74 Ground cable
75 Ground cable
76 Ground cable
77 Ground cable
78 Shielding
79 Opening
81 Conducting path pair
82 Conducting path pair
83 Conducting path pair
84 Contact
85 Shielding
90 Connecting device
91 Bracket
92 Connecting electrode/piercing contact
93 Opening
94 Cable
95a Piercing contact
95b Piercing contact
95c Insulating interruption knife
100 Line
101 Insulation
102 Line wire
103 Cable
104 Crimping device
110 Measurement tape
111 Conducting path
112 Consumer finger
120 Cable
121 Insulation
122 Wire
123 Capacitor plate
130 Cable
131 Cable
140 Cable
141 Cable
150 Socket
151 Measurement tape
152 Female contacting connector
153 Plug
160 Safety system
161 Safety controller
161 Elevator controller
163 Drive
164 Direct disconnection
165 Lines
O1 Optical switches
O2 Optical switches
O3 Optical switches
On Optical switches
166 Auxiliary devices
170 Optical sensor
171 Measurement tape
172 Support
180 Optical bridge
181 Main element
182 Leg
183 Leg
190 Measurement tape/code tape
191 Connecting device
192 Support
193 Movably supported contacting element
194 Piercing contacts

We claim:

1. A connecting device for connecting a transmission device for transmitting information, wherein the transmission device is attached to a measurement tape for determining the position of a cab in an elevator shaft, wherein the measurement tape is situated vertically in the elevator shaft, and is designed with respect to its length in such a way that it extends over at least two floors, and wherein the measurement tape includes a marking unit for marking at least two positions in the elevator shaft, wherein the marking unit runs along the length of the measurement tape, and wherein the measurement tape includes a carrier tape, wherein the transmission device includes at least one communication line for transmitting an information signal and/or at least one supply line for supplying power, and the at least one communication line runs along the length of the measurement tape, wherein the communication line is designed as an electrical line for transmitting an electrical signal or as a fiberglass line for transmitting an optical signal, wherein the connecting device is designed as a guide bracket for guiding and/or supporting the measurement tape, so that it at least partially surrounds the measurement tape, and wherein the guide bracket has at least one opening for reading out the marking unit, and wherein the connecting device has at least one connection contact for connecting to one of the communication lines and/or supply lines, wherein the at least one connection contact is movably supported in the connecting device in order to be able to compensate for relative movements.

2. The connecting device according to claim 1, wherein the connecting device is designed for wired electrical contacting, and comprises a piercing contact for contacting at least one of the contact lines in a piercing manner by breaching insulation of the contact line.

3. The connecting device according to claim 1, wherein the connecting device comprises at least one spring-loaded contact pin for wired electrical contacting configured to contact a contact line comprising a conducting path.

4. The connecting device according to claim 1, wherein the connecting device establishes a wireless connection to at least one of the contact lines.

5. The connecting device according to claim 1, wherein the connecting device comprises a connecting plug and/or as a male plug connection.

6. The connecting device according to claim 1, wherein a connection test device is provided for testing the connection to at least one of the contact lines at a certain position.

7. A peripheral device for elevator devices, comprising a position determination device having a connecting device according to claim 1.

8. The peripheral device according to claim 1, wherein a testing device tests the measurement tape for breaks and/or stretching of the measurement tape, by carrying out a runtime measurement of a signal through at least one of the contact lines.

9. An elevator device wherein a peripheral device is provided according to claim 1.

10. The connection device according to claim 1, wherein the connecting device is designed for wired electrical contact, and comprises a crimping device for establishing a crimp connection to at least one of the contact lines.

11. The connecting device according to claim 4, wherein the wireless connection comprises an inductive connection or a capacitive connection.

12. A peripheral device for elevator devices, comprising a safety device having a connection device according to claim 1.

13. A peripheral device for elevator devices, comprising a communication device having a connection device according to claim 1.

14. The peripheral device according to claim 1, wherein a testing device tests the measurement tape for breaks and/or stretching of the measurement tape, by a capacitance measurement of at least one of the contact lines.

15. The peripheral device according to claim 1, wherein a testing device tests the measurement tape for breaks and/or stretching of the measurement tape, by a continuity check of at least one of the contact lines.

16. The peripheral device according to claim 1, wherein a testing device tests the measurement tape for breaks and/or stretching of the measurement tape, by providing a connection test device for testing the connection to at least one of the contact lines at a certain position.

* * * * *